(12) United States Patent
Miyasaka

(10) Patent No.: US 10,237,510 B2
(45) Date of Patent: Mar. 19, 2019

(54) SIGNAL PROCESSING DEVICE AND SIGNAL PROCESSING METHOD

(71) Applicant: SOCIONEXT INC., Kanagawa (JP)

(72) Inventor: Shuji Miyasaka, Yokohama (JP)

(73) Assignee: Socionext Inc., Kanagawa (JP)

( * ) Notice: Subject to any disclaimer, the term of this patent is extended or adjusted under 35 U.S.C. 154(b) by 0 days.

(21) Appl. No.: 15/991,064

(22) Filed: May 29, 2018

(65) Prior Publication Data

US 2018/0278882 A1 Sep. 27, 2018

Related U.S. Application Data

(63) Continuation of application No. PCT/JP2016/082573, filed on Nov. 2, 2016.

(30) Foreign Application Priority Data

Dec. 2, 2015 (JP) .................................. 2015-236148

(51) Int. Cl.
*H04N 5/60* (2006.01)
*H04R 3/04* (2006.01)
*H03F 1/42* (2006.01)

(52) U.S. Cl.
CPC ............... *H04N 5/602* (2013.01); *H03F 1/42* (2013.01); *H04R 3/04* (2013.01)

(58) Field of Classification Search
CPC ............... H04N 5/60; H04R 3/04; H04R 3/00
USPC ...... 381/94.1, 98, 101, 118, 61, 62, 17, 106; 700/94
See application file for complete search history.

(56) References Cited

U.S. PATENT DOCUMENTS

| | | | |
|---|---|---|---|
| 6,111,960 A * | 8/2000 | Aarts ....................... | H04R 3/04 |
| | | | 381/61 |
| 6,792,119 B1 * | 9/2004 | Aarts ....................... | H04R 3/04 |
| | | | 381/61 |
| 2004/0071297 A1 | 4/2004 | Katou et al. | |

FOREIGN PATENT DOCUMENTS

| | | |
|---|---|---|
| JP | 2000-078497 A | 3/2000 |
| JP | 2004-101797 A | 4/2004 |
| JP | 2009-268014 A | 11/2009 |
| WO | 2013/024508 A1 | 2/2013 |

OTHER PUBLICATIONS

International Search Report issued in Application No. PCT/JP2016/082573 dated Jan. 17, 2017, with English translation.

* cited by examiner

*Primary Examiner* — Melur Ramakrishnaiah
(74) *Attorney, Agent, or Firm* — McDermott Will & Emery LLP

(57) ABSTRACT

A signal processing device includes: a resonant band-pass filter which extracts frequency components which cause resonance of a housing from an input signal; a harmonic generating unit which generates a harmonic signal for an output signal of the resonant band-pass filter; an adding unit which adds an output signal of the harmonic generating unit and at least a portion of frequency components of the input signal; and a resonant band-stop filter which removes the frequency components which cause the resonance of the housing from an output signal of the adding unit.

4 Claims, 8 Drawing Sheets

SIGNAL PROCESSING DEVICE AND SIGNAL PROCESSING METHOD

CROSS REFERENCE TO RELATED APPLICATIONS

This is a continuation application of PCT International Application No. PCT/JP2016/082573 filed on Nov. 2, 2016, designating the United States of America, which is based on and claims priority of Japanese Patent Application No. 2015-236148 filed on Dec. 2, 2015. The entire disclosures of the above-identified applications, including the specifications, drawings and claims are incorporated herein by reference in their entirety.

FIELD

The present disclosure relates to a signal processing device and a signal processing method.

BACKGROUND

With the recent advances in recording technology and broadcasting technology, the quality of broadcast content has improved. In particular, such advances have allowed an audio signal to include rich deep bass components. In contrast, in a television (TV) serving as a receiver of such an audio signal, resonance of the housing (so-called chattering) is likely to be caused by the deep bass components, as a result of design-oriented housing such as thinner or flat housing, and demands for cost reduction.

In order to solve such a problem, a technique has been developed for removing the frequency components which cause the chattering of the housing from an input audio signal (for example, Patent Literature (PTL) 1).

In the technique disclosed in PTL 1, when the frequency components which cause the chattering of the housing of a signal processing device are high, the level of attenuation performed by the band-stop filter is increased, whereas when the frequency components which cause the chattering of the housing are low, the level of attenuation performed by the band-stop filter is reduced. With this, the resonance of the housing caused by an input audio signal is reduced to prevent the sound of the input audio signal being impaired.

CITATION LIST

Patent Literature

[PTL 1] Japanese Unexamined Patent Application Publication No. 2000-078497
[PTL 2] Japanese Unexamined Patent Application Publication No. 2004-101797

SUMMARY

Technical Problem

However, in the technique disclosed in PTL 1, when the frequency components which cause the resonance of the housing rapidly varies in the input audio signal, detection of the frequency components which cause the resonance of the housing or correction or the like of the characteristics of the band-stop filter is lagged. This may cause the chattering or discomfort in sound due to rapidly performed correction of the characteristics of the band-stop filter.

The present disclosure has been conceived in view of such problems in the conventional techniques. An object of the present disclosure is to provide a signal processing device which is capable of reducing resonance of the housing caused by an input audio signal, as well as reducing impairment of the sound of the input audio signal.

Solution to Problem

In order to solve the above problems, a signal processing device according to one aspect of the present disclosure is a signal processing device which includes: a speaker; a housing to which the speaker is attached; a resonant band-pass filter which extracts a frequency component which causes resonance of the housing from an input signal; a harmonic generating unit which generates a harmonic signal for an output signal of the resonant band-pass filter; an adding unit which adds an output signal of the harmonic generating unit and at least a portion of a frequency component of the input signal; and a resonant band-stop filter which removes the frequency component which causes the resonance of the housing from an output signal of the adding unit.

Moreover, in order to solve the above problems, a signal processing method according to another aspect of the present disclosure is a signal processing method performed by a signal processing device which includes a speaker and a housing to which the speaker is attached. The method includes: extracting a frequency component which causes resonance of the housing from an input signal; generating a harmonic signal for the frequency component extracted in the extracting; adding the harmonic signal generated in the generating and at least a portion of a frequency component of the input signal; and removing the frequency component which causes the resonance of the housing from a signal obtained by the adding.

Advantageous Effects

According to the present disclosure, it is possible to provide a signal processing device which is capable of reducing resonance of the housing caused by an input audio signal, as well as reducing impairment of the sound of the input audio signal.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT (Underlying Knowledge Forming Basis of the Present Disclosure)

Figure 7:
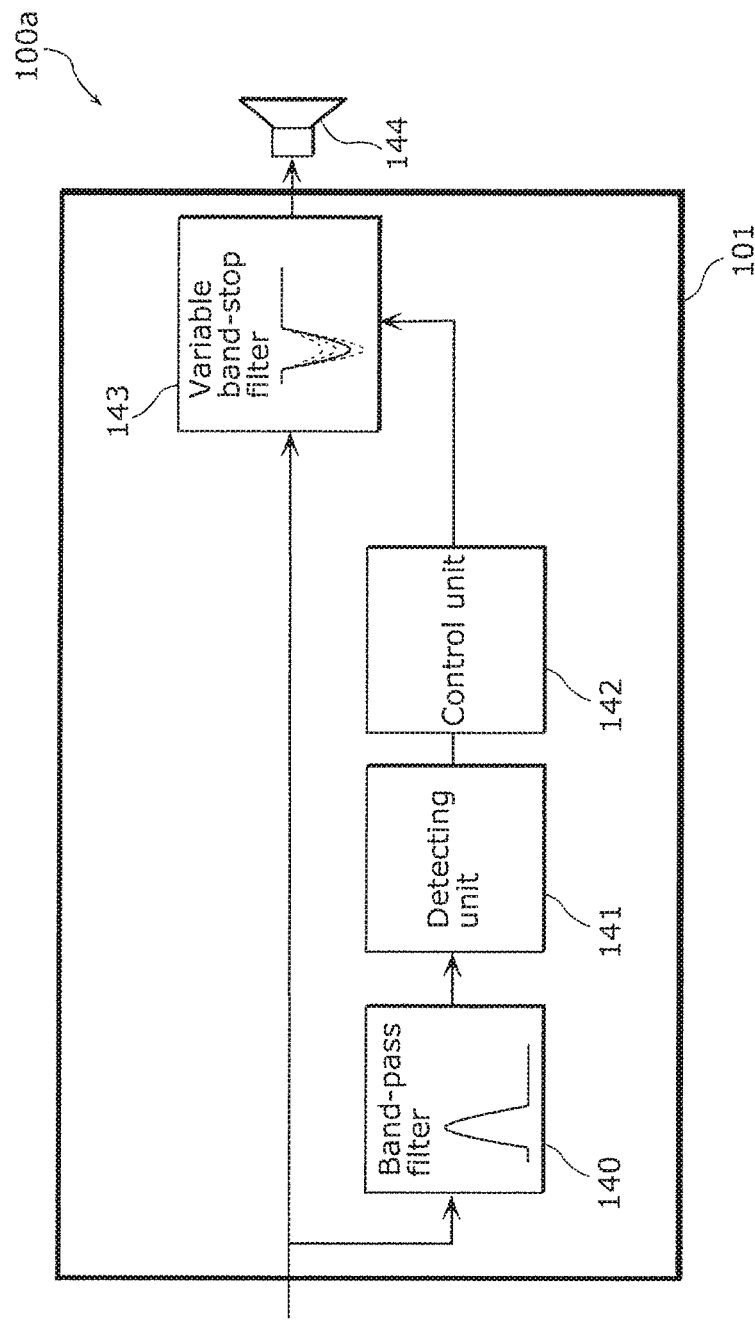
FIG. 7 is a block diagram illustrating a configuration of a signal processing device according to a conventional technique.
Figure 8:
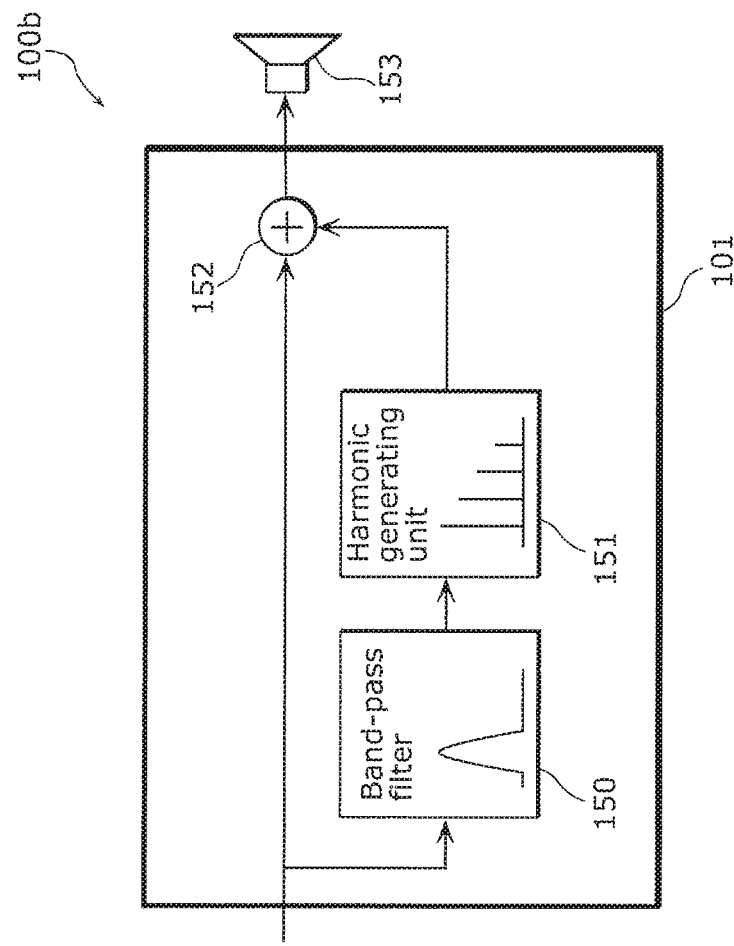
FIG. 8 is a block diagram illustrating a configuration of a signal processing device which uses missing fundamental phenomenon.

First, the problems to be solved by the present disclosure and underlying knowledge forming basis of a signal processing device according to Embodiment 1 will be described with reference to FIG. 7 and FIG. 8. FIG. 7 is a block diagram illustrating a configuration of a signal processing device 100a according to a conventional technique. FIG. 8 is a block diagram illustrating a configuration of a signal processing device 100b which uses missing fundamental phenomenon.

The signal processing device 100a illustrated in FIG. 7 includes: a band-pass filter 140 which extracts the frequency components which cause chattering of a housing 101 from an input signal; a variable band-stop filter 143 which attenuates the frequency components which cause the resonance of the housing 101 from the input signal; a detection unit 141 which detects the level of amplitude of an output signal of the band-pass filter 140; and a control unit 142 which determines the gain (the level of attenuation) of the variable band-stop filter 143 according to a detection value of the detection unit 141. Moreover, a speaker 144 which outputs the sound of an output signal of the variable band-stop filter 143 is attached to the housing 101. In the conventional technique, with such a configuration, when the frequency components which cause the chattering of the housing 101 is high, the level of attenuation performed by the variable band-stop filter 143 is increased, and when the frequency components which cause the chattering of the housing 101 is low, the level of attenuation performed by the variable band-stop filter 143 is reduced. By doing so, the resonance of the housing 101 caused by the input audio signal is reduced, without impairing the sound of the input audio signal to the maximum extent.

Moreover, in the technique illustrated in FIG. 8, a psychoacoustic phenomenon referred to as the missing fundamental phenomenon is used. The missing fundamental phenomenon is a phenomenon in which even if the fundamental sound (for example, 50 Hz sound) is missing, when its harmonics (harmonic components) are present (when the fundamental sound is 50 Hz, and harmonics such as 100 Hz, 150 Hz, 200 Hz, 250 Hz, etc., are present), the missing fundamental sound is auditorily heard. Note that, in the present application, the second harmonic is referred to as the first overtone, the third harmonic is referred to as the second overtone, the (N+1) harmonic is referred to as the N-th overtone.

The signal processing device 100b illustrated in FIG. 8 includes: a band-pass filter 150 which extracts the frequency components of the fundamental sound from an input signal; a harmonic generating unit 151 which generates a harmonic signal for an output signal of the band-pass filter 150; an adding unit 152 which adds an output signal of the harmonic generating unit 151 and at least a portion of the frequency components of the input signal; and a speaker 153 which outputs the sound of an output signal of the adding unit 152. With such a configuration, in the signal processing device 100b illustrated in FIG. 8, the low frequency components serving as the fundamental sound are added to the input signal, and outputted by the speaker 153. Hence, even if the speaker 153 cannot reproduce the frequency components serving as the fundamental sound, a listener can hear the fundamental sound components. Therefore, the signal processing device 100b illustrated in FIG. 8 is capable of maintaining the good sound quality even with an inexpensive speaker (see PTL 2). The signal processing device according to the present disclosure is configured with the afore-mentioned knowledge as the basis of the present disclosure.

Hereinafter, a signal processing device, which is capable of solving the above described problems, reducing resonance of the housing caused by an input audio signal, and reducing the sound of the input audio signal being impaired, will be described with the following embodiment as an example. The following embodiment shows one specific example. The numerical values, shapes, materials, structural elements, arrangement positions and connection states of the structural elements, steps, the order of the steps, etc., indicated in the embodiment below are examples, and are not intended to limit the present disclosure. Moreover, among the structural elements in the following embodiment, the structural elements which are not recited in the independent claims defining the most generic concept are described as optional structural elements.

Embodiment 1

A signal processing device 1 according to Embodiment 1 will be described with reference to the drawings.

Figure 1:
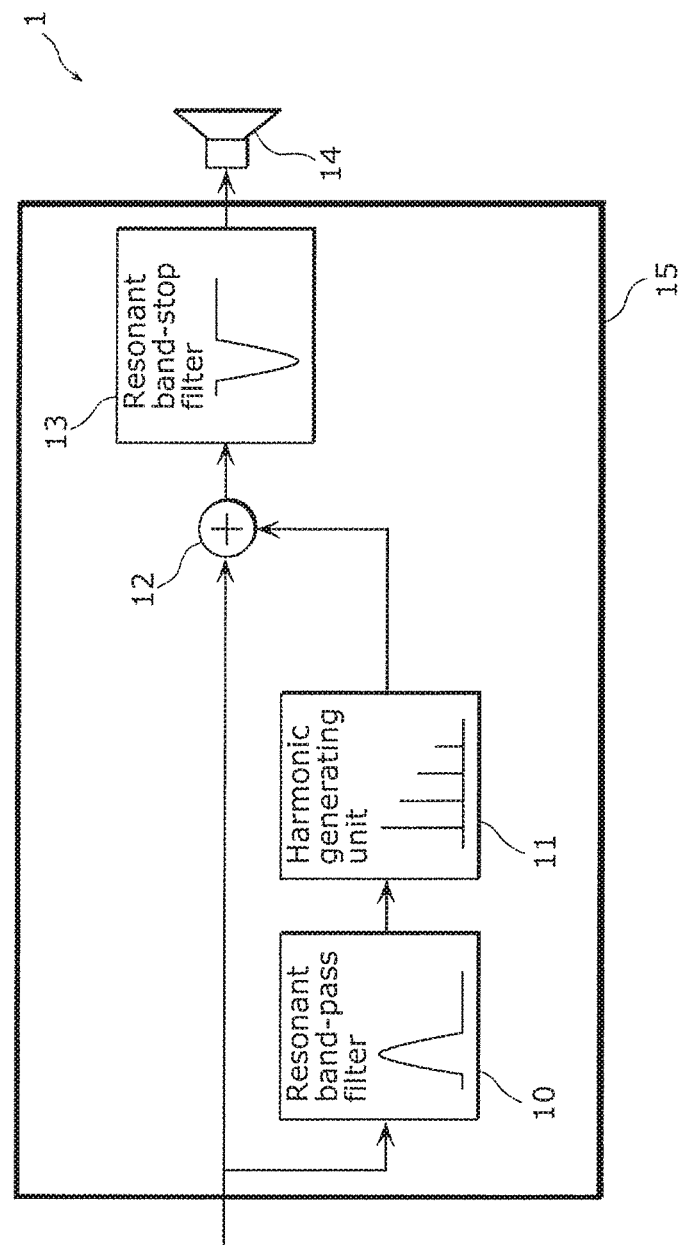
FIG. 1 is a block diagram illustrating a configuration of a signal processing device according to Embodiment 1.
Figure 2:
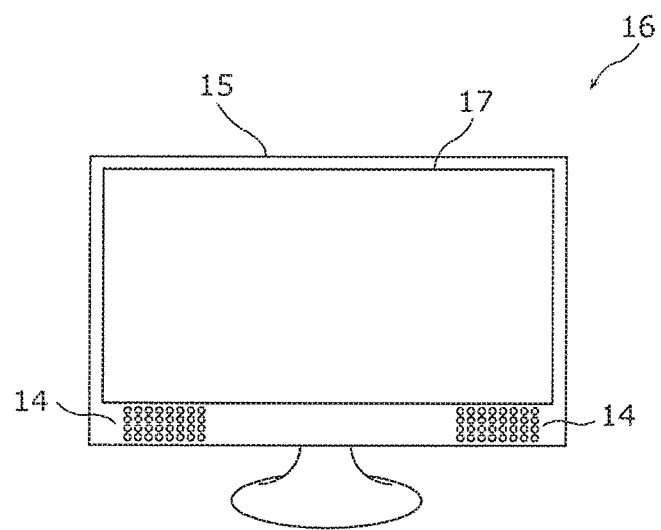
FIG. 2 is an external view of a digital television according to Embodiment 1.

FIG. 1 illustrates a configuration of the signal processing device 1 according to Embodiment 1. FIG. 2 is an external view of a digital television according to Embodiment 1.

The signal processing device 1 according to Embodiment 1 includes a speaker 14, and a housing 15 to which the speaker 14 is attached. The signal processing device 1 is capable of reducing resonance of the housing 15 caused by an input audio signal, as well as reducing the sound of the input audio signal being impaired.

The signal processing device 1 illustrated in FIG. 1 includes: a resonant band-pass filter 10 which extracts the frequency components which cause resonance of the housing 15 from an input signal; a harmonic generating unit 11 which generates a harmonic signal for an output signal of the resonant band-pass filter 10; an adding unit 12 which adds an output signal of the harmonic generating unit 11 and at least a portion of the frequency components of the input signal; a resonant band-stop filter 13 which removes the frequency components which cause the resonance from an output signal of the adding unit 12; and the speaker 14 which is attached to the housing 15.

The signal processing device 1 illustrated in FIG. 1 is, for example, disposed in the housing 15 of a digital television 16 whose external view is illustrated in FIG. 2.

In FIG. 2, the digital television 16 includes, for example, the speakers 14, and a display 17 in the housing 15. The speakers 14 illustrated in FIG. 2 are the same as the speaker 14 illustrated in FIG. 1. Moreover, the housing 15 illustrated in FIG. 2 is the same as the housing 15 illustrated in FIG. 1.

The operations of the signal processing device 1 thus configured will be described below.

First, the resonant band-pass filter 10 extracts the frequency components which cause resonance of the housing 15 from an input signal. For example, when the frequency components around 50 Hz are the cause of the resonance of the housing 15, the resonant band-pass filter 10 extracts the frequency components including 50 Hz. Note that the resonant band-pass filter 10 may be a low-pass filter including 50 Hz.

Subsequently, the harmonic generating unit 11 generates a harmonic signal for an output signal of the resonant band-pass filter 10. A harmonic signal may be generated by any type of unit, and, for example, may be generated by the unit disclosed in PTL 2.

Subsequently, the adding unit 12 adds an output signal of the harmonic generating unit 11 and the input signal. Here, the input signal that is added to the output signal of the harmonic generating unit 11 may include at least a portion of the frequency components of the input signal. For example, the input signal may include the frequency components processed for sound quality adjustment.

Subsequently, the resonant band-stop filter 13 removes the frequency components which cause the resonance from an output signal of the adding unit 12. In the signal processing device 1 according to Embodiment 1, the frequency components around 50 Hz are assumed to be the cause of the resonance of the housing 15, and thus, the resonant band-stop filter 13 attenuates the frequency band including 50 Hz. Note that the sound can be maintained because the harmonic components have been generated by the harmonic generating unit 11. Hence, the resonant band-stop filter 13 may attenuate the frequency components of the band including 50 Hz. This reliably reduces the chattering of the housing 15.

Finally, the speaker 14 outputs the sound of an output signal of the resonant band-stop filter 13. The speaker 14 is attached to the housing 15. The frequency components which cause the resonance of the housing 15 have been removed from the output signal of the resonant band-stop filter 13.

As described above, the signal processing device 1 according to Embodiment 1 includes: the resonant band-pass filter 10 which extracts the frequency components which cause the resonance of the housing 15 from an input signal; the harmonic generating unit 11 which generates a harmonic signal for an output signal of the resonant band-pass filter 10; the adding unit 12 which adds an output signal of the harmonic generating unit 11 and at least portion of the frequency components of the input signal; and the resonant band-stop filter 13 which removes the frequency components which cause the resonance from an output signal of the adding unit 12. With this, it is possible to reduce the resonance of the housing 15. Moreover, the frequency components which have been attenuated to reduce the resonance of the housing 15 can be auditorily compensated by the psychoacoustic phenomenon of the missing fundamental.

Note that, in the signal processing device 1 according to Embodiment 1, the frequency components which cause the resonance of the housing 15 is assumed to be 50 Hz, but the value differs depending on the devices. For example, when the frequency components which cause the resonance of the housing 15 is 100 Hz, the third harmonic (second overtone) is already 300 Hz, and thus, generating much higher harmonics results in an output of rather an unpleasant noise. In contrast, when the frequency components which cause the resonance of the housing 15 is 50 Hz, even if the fifth harmonic is generated, the fifth harmonic is still 250 Hz which is less likely to be an unpleasant noise. Accordingly, the level of harmonic that is generated differs depending on the level of the frequency components which cause the resonance of the housing 15.

Figure 3:
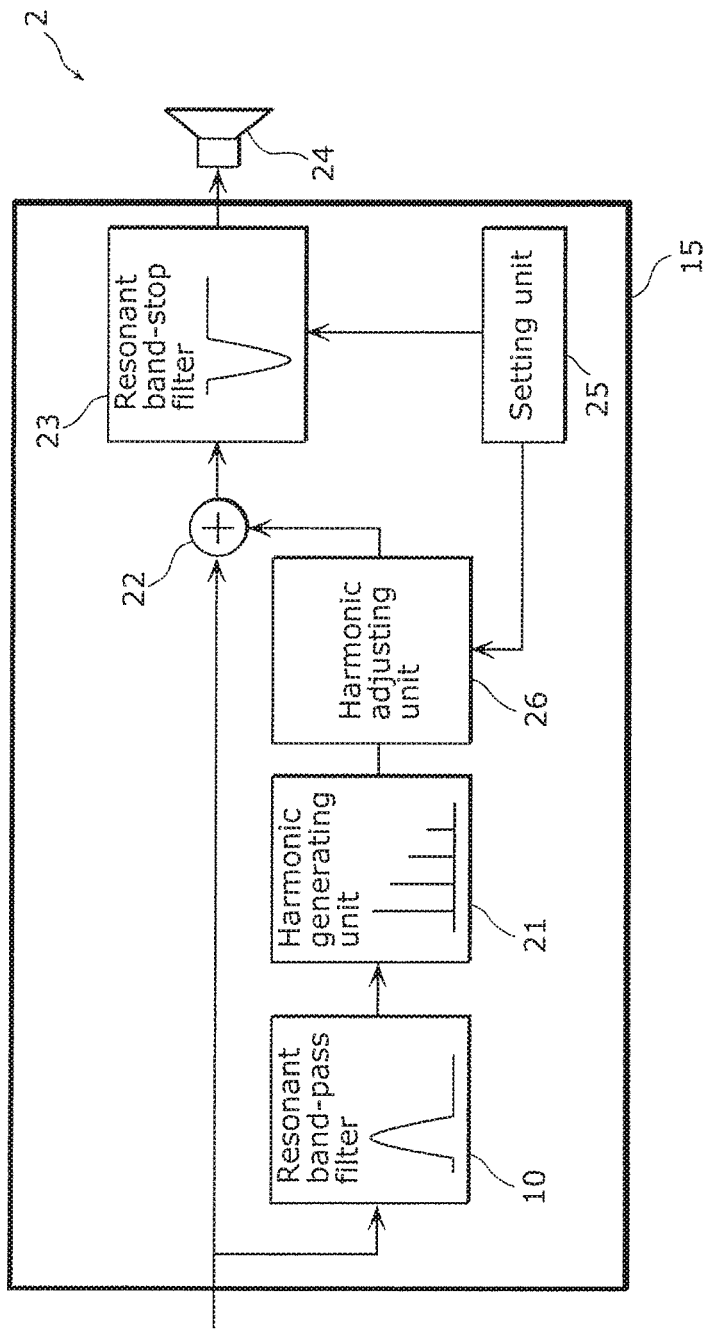
FIG. 3 is a block diagram illustrating a configuration of a signal processing device for meeting various resonant frequencies.

Hereinafter, a configuration of a signal processing device 2 for adjusting the level of harmonic that is generated depending on the level of the frequency components which cause the resonance of the housing 15 will be described. FIG. 3 is a block diagram illustrating a configuration of the signal processing device 2 for meeting various resonant frequencies.

As illustrated in FIG. 3, the signal processing device 2 includes the resonant band-pass filter 10, a harmonic generating unit 21, an adding unit 22, a resonant band-stop filter 23, a speaker 24, a setting unit 25, and a harmonic adjusting unit 26.

The signal processing device 2 is different from the signal processing device 1 illustrated in FIG. 1 in that the signal processing device 2 includes the setting unit 25 which sets information on the characteristics of the housing 15, and the harmonic adjusting unit 26 which adjusts an output signal of the harmonic generating unit 21 according to the information set by the setting unit 25. The setting unit 25 sets, as the information on the characteristics of the housing 15, information (frequency F) that indicates the frequency components which cause resonance of the housing 15.

With such a configuration, when the setting unit 25 sets the frequency F which causes the resonance of the housing 15, the harmonic adjusting unit 26 performs adjustment such that a signal including an N-th overtone generated by the harmonic generating unit 21 is sent to the adding unit 22, when the frequency F is lower than a predetermined value (P). Moreover, when the frequency F is higher than or equal to the predetermined value (P), the harmonic adjusting unit 26 performs adjustment such that a signal including an M-th overtone (where M is less than N) generated by the harmonic generating unit 21 is sent to the adding unit 22.

Here, the relationships among F, P, and N described above are determined as described below. Harmonic components tend to be an unpleasant sound when reaching overly high frequency components. For example, it is assumed that when harmonic components are present in the frequency bands above 400 Hz, the harmonic components become an unpleasant sound. Moreover, presence of overly higher harmonic components also results in an unpleasant sound. For example, presence of components up to the third overtone (fourth harmonic) is enough to make the fundamental sound sufficiently perceived due to the missing fundamental phenomenon, and thus, the higher harmonic components are unnecessary. In this case, N is 3, and P is 100. In other words, when the frequency F is higher than or equal to 100 Hz, the third overtone is higher than or equal to 400 Hz, which results in an unpleasant sound being perceived. On the other hand, when the frequency F is lower than 100 Hz, the third overtone is less than 400 Hz, and thus, generating up to the third overtone does not result in an unpleasant sound. Accordingly, when the frequency F is lower than P, the N-th overtone is generated, and when the frequency F is higher than or equal to P, the M-th overtone, which is lower than the N-th overtone, is generated. Note that the above described values of F, P, N, and M are examples.

By doing so, control can be performed such that the harmonic components do not have adverse effects on the resultant sound. Note that the above described degree (M-th) may be 0.

Moreover, the sensitivity which causes resonance of the housing 15 (resonance sensitivity) also differs depending on the devices. Here, the term "sensitivity" refers to how sensitive the resonance occurs. When the value of the sensitivity is greater than a predetermined value, the sensitivity is assumed to be high (the state where chattering of the housing 15 easily occurs), and when the value is less than or equal to the predetermined value, the sensitivity is assumed to be low.

Figure 4:
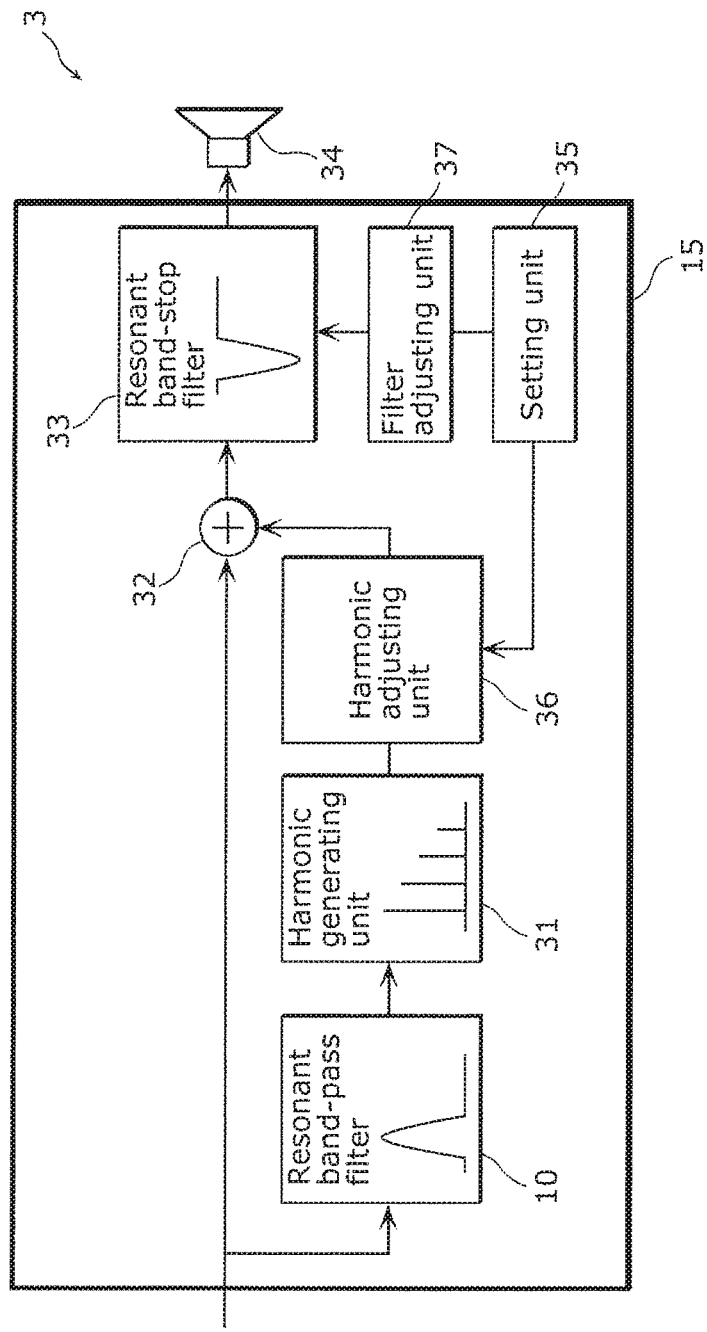
FIG. 4 is a block diagram illustrating a configuration of a signal processing device for meeting various resonance sensitivities.

A configuration of a signal processing device 3 for adjusting the sensitivity of resonance of the housing 15 will be described below. FIG. 4 is a block diagram illustrating a configuration of the signal processing device 3 for meeting various resonance sensitivities.

As illustrated in FIG. 4, the signal processing device 3 includes the resonant band-pass filter 10, a harmonic generating unit 31, an adding unit 32, a resonant band-stop filter 33, a speaker 34, a setting unit 35, a harmonic adjusting unit 36, and a filter adjusting unit 37.

The signal processing device 3 is different from the signal processing device 1 illustrated in FIG. 1 in that the signal processing device 3 includes: the setting unit 35 which sets information on the characteristics of the housing 15; the harmonic adjusting unit 36 which adjusts an output signal of the harmonic generating unit 31 according to the information set by the setting unit 35; and a filter adjusting unit 37 which adjusts the gain (level of attenuation) of the resonant band-stop filter 33 according to the information set by the setting unit 35. The setting unit 35 sets information indicating the resonance sensitivity of the housing 15 as the information on the characteristics of the housing 15.

With such a configuration, the harmonic adjusting unit 36 amplifies an output signal of the harmonic generating unit 31 by A times and sends the amplified signal to the adding unit 32, when the information (S) indicating the sensitivity set by the setting unit 35 is greater than a predetermined value (for example, the reciprocal of X below) (when chattering of the housing 15 easily occurs). Moreover, when the information (S) indicating the sensitivity set by the setting unit 35 is less than or equal to the predetermined value, the harmonic adjusting unit 36 amplifies the output signal of the harmonic generating unit 31 by B times (where B is less than A), and sends the amplified signal to the adding unit 32. Note that A and B are values which satisfy the relation of A>B. Here, A and B each may be set to be greater than 1.

Moreover, when the information (S) indicating the sensitivity set by the setting unit 35 is greater than the predetermined value (when chattering of the housing 15 easily occurs), the harmonic adjusting unit 36 sets the gain of the resonant band-stop filter 33 to be −G (so that the level of attenuation is high). Moreover, when the information (S) indicating the sensitivity set by the setting unit 35 is less than or equal to the predetermined value, the harmonic adjusting unit 36 sets the gain of the resonance band-stop filter 33 to be −H which is greater than −G (so that the level of attenuation is low). By doing so, even when the chattering of the housing 15 easily occurs, the chattering can be reliably reduced. The frequency band loss caused by the chattering can be compensated by increasing the harmonics. Moreover, when the chattering of the housing 15 is less likely to occur, sound close to the original sound can be output by reducing the harmonics.

Here, the above described S is as described below. When a signal having an amplitude which gradually increases is output and the amplitude value at which the chattering of the housing 15 starts to occur is X, the chattering of the housing 15 is less likely to occur when X is large, and the chattering of the housing 15 is likely to occur when X is small. Since it is defined that the chattering is likely to occur the greater the value of S becomes, S is an index which decreases in accordance with an increase in X, such as S being the reciprocal of X. Moreover, the above described −G and −H are values obtained by decibel conversion of the gain of the filter. For example, −G is −18 dB, and −H is −6 dB. Note that the above values of H and G are examples.

The configurations of the respective units, filters and the like of the signal processing devices 1 to 3 may be entirely or partially implemented by hardware, or software.

Figure 5:
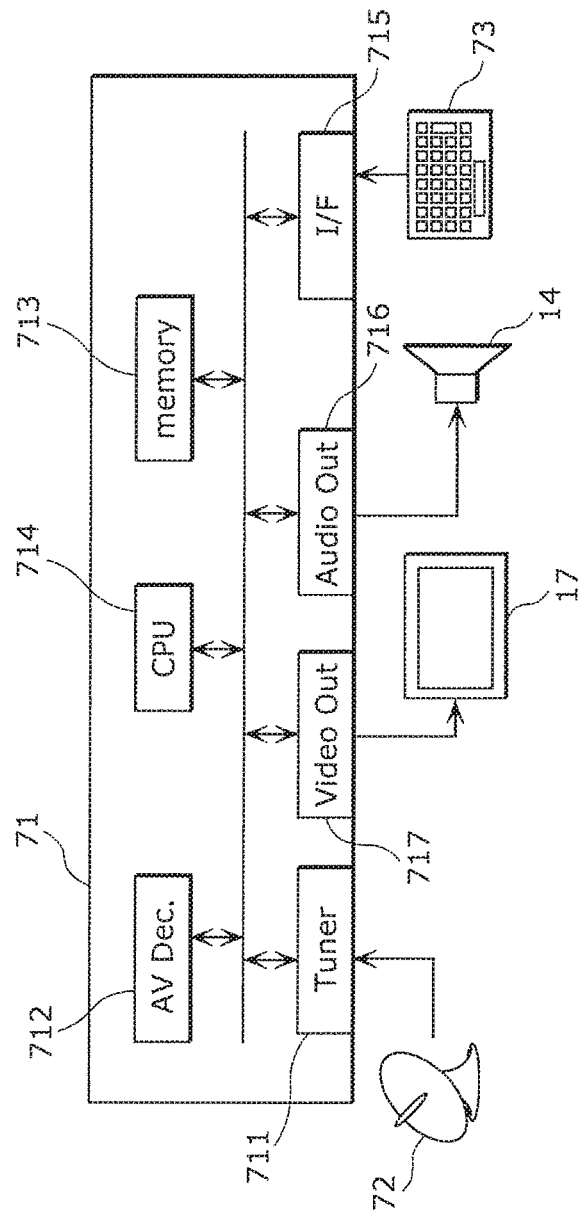
FIG. 5 is a block diagram of the digital television according to Embodiment 1.

FIG. 5 is a block diagram of a digital television 16 according to Embodiment 1, and illustrates a configuration of the digital television 16 implementing the signal processing devices 1 to 3 by software.

In FIG. 5, the digital television 16 includes the speaker 14, the display 17, a system LSI (Large Scale Integration: large scale integrated circuit) 71, an antenna 72, and a keyboard 73. The system LSI 71 includes a tuner 711, an AV decoder 712, a memory 713, a central processing unit (CPU) 714, an interface (I/F) 715, audio output unit 716, and a video output unit 717.

The digital television 16 may include, among the above structural elements, only the speaker 14, the display 17, and the system LSI 71. In that case, the digital television 16 may be connected to the antenna 72 or the keyboard 73 by a cable or the like.

The antenna 72 receives a broadcast signal of the digital television 16, and transmits the received signal to the System LSI 71. The system LSI 71 outputs an audio signal and a video signal by demodulating the broadcast signal transmitted from the antenna 72. The speaker 14 converts the audio signal transmitted from the system LSI 71 into sound and outputs the sound. The display 17 converts the video signal transmitted from the system LSI 71 into video and outputs the video.

In the system LSI 71, the broadcast signal is converted to a digital signal of a desired channel by the tuner 711, and transmitted to the AV decoder 712. In the AV decoder 712, the digital signal transmitted from the tuner 711 is decoded to generate an audio signal and a video signal. The memory 713 stores a program for realizing the functions of the above-described signal processing devices when executed by the CPU 714. When the CPU 714 reads out the program from the memory 713 and executes the program, the audio signal generated by the AV decoder 712 is processed and transmitted to the audio output unit 716. The audio output unit 716 outputs the audio signal. The video signal generated by the AV decoder 712 is transmitted to the video output unit 717. The video output unit 717 outputs the video signal.

The system LSI 71 further includes an interface 715. An external input unit, such as the keyboard 73, can be connected to the interface 715. The interface 715 is used to set the frequency components which cause resonance of the housing 15 of the digital television 16, information indicating the resonance sensitivity of the housing 15, and the like to the system LSI 71 using the keyboard 73 or the like.

Figure 6:
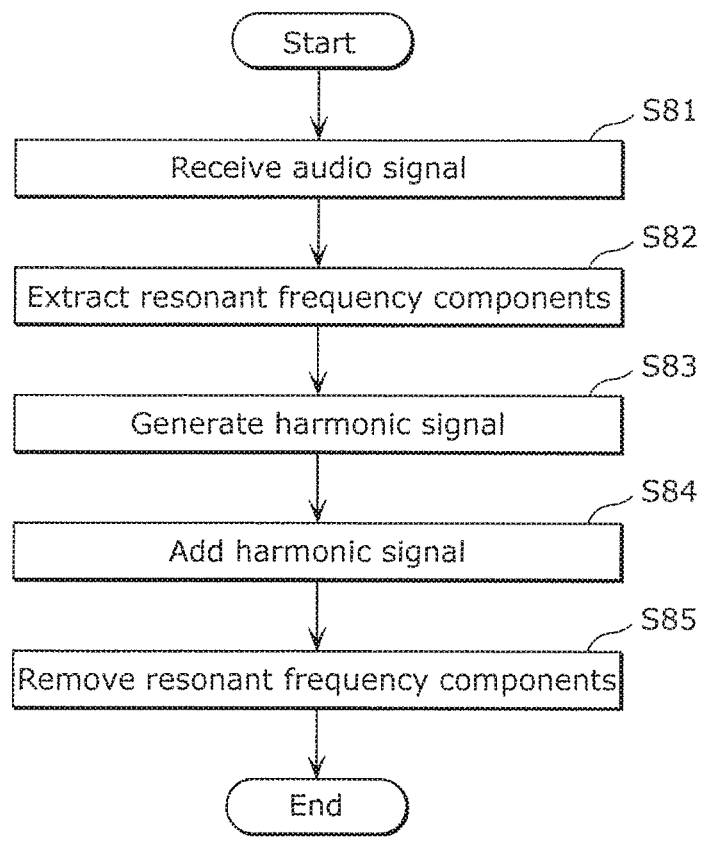
FIG. 6 is a flowchart of the operations of the signal processing device according to Embodiment 1.

Next, a signal processing method performed by the signal processing device 1 will be described. FIG. 6 is a flowchart of the operations of the signal processing device 1 according to Embodiment 1.

As illustrated in FIG. 6, first, the signal processing device 1 according to Embodiment 1 receives an audio signal (step S81). Subsequently, the resonant band-pass filter 10 extracts the resonant frequency components of the housing 15 included in the audio signal received at step S81 (step S82). Subsequently, a harmonic signal is generated, by the harmonic generating unit 11, for the resonant frequency components of the housing 15 extracted in step S82 (step S83). Next, the adding unit 12 adds the harmonic signal generated in step S83 and the audio signal received by the signal processing device 1 in step S81 (step S84). Then, the resonant band-stop filter 13 removes the frequency components which cause the resonance from the signal obtained by the adding in step S84 (step S85). With the signal processing method as described above, the signal processing device 1 is capable of reducing the resonance of the housing 15, as well as auditorily compensating the frequency components attenuated in order to reduce the resonance of the housing 15, using the psychoacoustic phenomenon of the missing fundamental.

Note that the operations similar to those performed by the signal processing device 1 are performed by the signal processing device 2 and the signal processing device 3, and thus, the descriptions thereof will be omitted.

As described above, according to the signal processing devices 1 to 3 according to Embodiment 1, it is possible to reduce the resonance of the housing caused by an input audio signal, and to reduce the sound of the input audio signal being impaired.

Although the signal processing device according to one or more aspects has been described based on the embodiment, the present disclosure is not limited to such an embodiment. Although only one exemplary embodiment of the present disclosure have been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The signal processing device according to the present disclosure can be applied to televisions, car audio, portable devices such as smart phones and tablets.

The invention claimed is:

1. A signal processing device comprising:
   a speaker;
   a housing to which the speaker is attached;
   a resonant band-pass filter which extracts a frequency component which causes resonance of the housing from an input signal;
   a harmonic generating unit configured to generate a harmonic signal for an output signal of the resonant band-pass filter;
   an adding unit configured to add an output signal of the harmonic generating unit and at least a portion of a frequency component of the input signal; and
   a resonant band-stop filter which removes the frequency component which causes the resonance of the housing from an output signal of the adding unit.

2. The signal processing device according to claim 1, further comprising:
   a setting unit configured to set information on a characteristic of the housing; and
   a harmonic adjusting unit configured to adjust the output signal of the harmonic generating unit according to the information set by the setting unit,
   wherein the setting unit is configured to set a frequency which causes the resonance of the housing as the information, and
   the harmonic adjusting unit is configured to:
      perform adjustment so that a signal including an N-th overtone generated by the harmonic generating unit is sent to the adding unit, when the frequency set by the setting unit is lower than a predetermined value; and
      perform adjustment so that a signal including an M-th overtone generated by the harmonic generating unit is sent to the adding unit, when the frequency set by the setting unit is higher than or equal to the predetermined value, M being less than N.

3. The signal processing device according to claim 1, further comprising:
   a setting unit configured to set information on a characteristic of the housing;
   a harmonic adjusting unit configured to adjust the output signal of the harmonic generating unit according to the information set by the setting unit; and
   a filter adjusting unit configured to adjust a gain of the resonant band-stop filter according to the information set by the setting unit,
   wherein the setting unit is configured to set a resonance sensitivity of the housing as the information,
   the harmonic adjusting unit is configured to:
      amplify the output signal of the harmonic generating unit by A times and send the amplified output signal to the adding unit, when the resonance sensitivity of the housing set by the setting unit is greater than a predetermined value; and
      amplify the output signal of the harmonic generating unit by B times, when the resonance sensitivity of the housing set by
   the setting unit is less than or equal to the predetermined value, B being less than A, and
   the filter adjusting unit is configured to:
      set the gain of the resonant band-stop filter to −G, when the resonance sensitivity is greater than the predetermined value; and
      set the gain of the resonant band-stop filter to −H, when the resonance sensitivity is less than or equal to the predetermined value, −H being greater than −G.

4. A signal processing method performed by a signal processing device which includes a speaker and a housing to which the speaker is attached, the method comprising:
   extracting a frequency component which causes resonance of the housing from an input signal;
   generating a harmonic signal for the frequency component extracted in the extracting;
   adding the harmonic signal generated in the generating and at least a portion of a frequency component of the input signal; and
   removing the frequency component which causes the resonance of the housing from a signal obtained by the adding.

* * * * *